(12) United States Patent
Park et al.

(10) Patent No.: US 11,928,575 B2
(45) Date of Patent: Mar. 12, 2024

(54) ACTIVATION FUNCTION PROCESSING METHOD, ACTIVATION FUNCTION PROCESSING CIRCUIT, AND NEURAL NETWORK SYSTEM INCLUDING THE SAME

(71) Applicant: SK hynix Inc., Icheon (KR)

(72) Inventors: Yong Sang Park, Icheon (KR); Joo Young Kim, Icheon (KR)

(73) Assignee: SK hynix Inc., Icheon (KR)

( * ) Notice: Subject to any disclaimer, the term of this patent is extended or adjusted under 35 U.S.C. 154(b) by 737 days.

(21) Appl. No.: 17/087,135

(22) Filed: Nov. 2, 2020

(65) Prior Publication Data

US 2021/0334631 A1    Oct. 28, 2021

(30) Foreign Application Priority Data

Apr. 22, 2020    (KR) .................. 10-2020-0048732

(51) Int. Cl.
*G06N 3/04* (2023.01)
*G06F 12/02* (2006.01)
*G06N 3/048* (2023.01)
*G06N 3/063* (2023.01)
*G06N 5/025* (2023.01)
*H03K 19/17728* (2020.01)

(52) U.S. Cl.
CPC ......... *G06N 3/048* (2023.01); *G06F 12/0292* (2013.01); *G06N 3/063* (2013.01); *G06N 5/025* (2013.01); *H03K 19/17728* (2013.01)

(58) Field of Classification Search
CPC ........ G06N 3/048; G06N 3/063; G06N 5/025; G06F 12/0292; H03K 19/17728
See application file for complete search history.

(56) References Cited

U.S. PATENT DOCUMENTS

| | | | |
|---|---|---|---|
| 10,733,498 B1 * | 8/2020 | Diamant | G06F 17/17 |
| 10,990,354 B2 * | 4/2021 | Jang | G06F 7/38 |
| 10,997,510 B1 * | 5/2021 | Sodani | G06F 9/30174 |
| 11,049,013 B1 * | 6/2021 | Duong | G06N 3/08 |
| 11,150,872 B2 * | 10/2021 | Wang | G06F 7/485 |
| 11,182,666 B1 * | 11/2021 | Phebus | G06N 3/048 |
| 11,327,713 B2 * | 5/2022 | Wang | G06F 17/17 |
| 11,327,717 B2 * | 5/2022 | Wang | G06F 7/483 |
| 11,328,038 B2 * | 5/2022 | Wang | G06F 5/01 |
| 11,341,400 B1 * | 5/2022 | Ratnayake | G06N 3/048 |
| 11,423,313 B1 * | 8/2022 | Diamant | G06N 3/048 |

(Continued)

FOREIGN PATENT DOCUMENTS

| | | | | |
|---|---|---|---|---|
| CN | 110688088 A | * | 1/2020 | ............. G06F 7/523 |
| KR | 20190042470 A | | 4/2019 | |
| WO | WO 202/093676 | * | 5/2020 | ......... G06F 12/1027 |

OTHER PUBLICATIONS

InnovationQ+ (Year: 2023).*
NPL History Search (Year: 2023).*

*Primary Examiner* — Samson B Lemma
*Assistant Examiner* — Richard W Cruz-Franqui

(57) ABSTRACT

An activation function processing method includes processing a first activation function in a first mode by referring to a shared lookup table that includes a plurality of function values of the first activation function; and processing a second activation function in a second mode by referring to the shared lookup table, the second activation function being a different function than the first activation function.

20 Claims, 11 Drawing Sheets

(56) References Cited

U.S. PATENT DOCUMENTS

| | | | |
|---|---|---|---|
| 11,468,145 B1* | 10/2022 | Duong | G06F 17/16 |
| 11,568,227 B1* | 1/2023 | Ko | G06N 3/04 |
| 2019/0042924 A1* | 2/2019 | Pasca | G06F 7/548 |
| 2019/0199353 A1* | 6/2019 | Kim | G06F 30/34 |
| 2019/0272310 A1* | 9/2019 | Sakaguchi | G06F 7/548 |
| 2021/0295134 A1* | 9/2021 | Stevens | G06F 5/01 |
| 2021/0397596 A1* | 12/2021 | Antony | G06N 3/04 |

* cited by examiner

ACTIVATION FUNCTION PROCESSING METHOD, ACTIVATION FUNCTION PROCESSING CIRCUIT, AND NEURAL NETWORK SYSTEM INCLUDING THE SAME

CROSS-REFERENCES TO RELATED APPLICATION

The present application claims priority under 35 U.S.C. § 119(a) to Korean patent application number 10-2020-0048732, filed on Apr. 22, 2020, in the Korean Intellectual Property Office, which is incorporated herein by reference in its entirety as set forth in full.

BACKGROUND

1. Technical Field

Various embodiments relate to a neural network system, and more particularly, to a neural network system configured to process an is activation function.

2. Related Art

A deep learning technology processes big data or massive information to generate useful information. The state-of-the-art deep learning technology is developing to process more promptly a greater amount of data. A deep-learning-based deep neural network may have nonlinearity through application of an activation function. It is one of development challenges of a neural network system to effectively process an activation function at less cost.

SUMMARY

Various embodiments of the present disclosure provide an activation function processing method, an activation function processing circuit, and a neural network system including the same for processing an activation function with reduced memory costs.

In accordance with an embodiment, an activation function processing method may include processing a first activation function in a first mode by referring to a shared lookup table that includes a plurality of function values of the first activation function; and processing a second activation function in a second mode by referring to the shared lookup table, the second activation function being a different function than the first activation function.

In accordance with an embodiment, an activation function processing circuit may include a lookup table access unit configured to determine a function value of a first activation function corresponding to an input value of the first activation function by referring to a shared lookup table that includes a plurality of function values of the first activation function; an input value conversion unit configured to convert an input value of a second activation function into the input value of the first activation function in a predetermined mode, the second activation function being a different function than the first activation function; and a function value conversion unit configured to convert the function value of the first activation function into a function value of the second activation function in the predetermined mode.

In accordance with an embodiment, a neural network system may include an activation function processing unit. The activation function processing unit may receive a first input value of a first activation function and determine a function value of the first activation function corresponding to the first input value by referring to a shared lookup table including a plurality of function values of the first activation function, and receive a second input value of a second activation function and determine a function value of a second activation function corresponding to the second input value by referring to the shared lookup table, the first and second activation functions being different functions.

In accordance with the embodiments, the activation function processing method, the activation function processing circuit, and the neural network system including the same may reduce memory costs for processing activation functions.

BRIEF DESCRIPTION OF THE DRAWINGS

Features, aspects, and embodiments are described in conjunction with the attached drawings, in which.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and, in some instances, proportions may have been exaggerated in order to clearly illustrate features of the embodiments. The terminology used herein is for the purpose of describing particular embodiments only and is not intended to be limiting of the invention.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, exemplary embodiments of the present disclosure will be described below with reference to the accompanying drawings.

Figure 1:
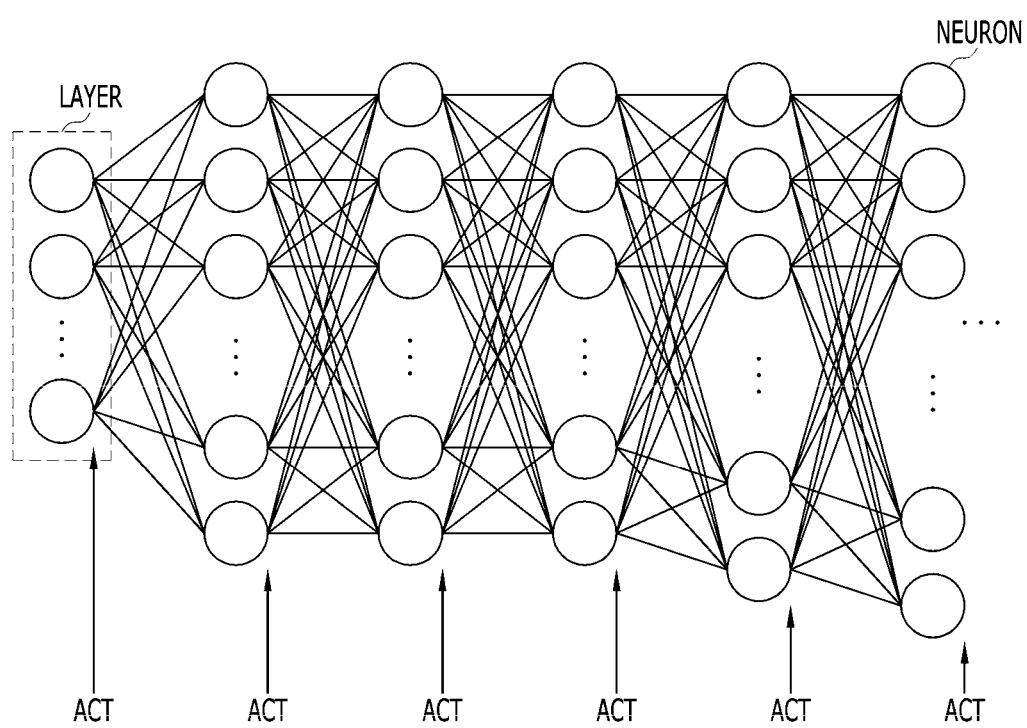
FIG. 1 illustrates a deep neural network comprising a plurality of layers.

FIG. 1 illustrates a deep neural network comprising a plurality of layers, each layer including a plurality of neurons.

An activation function ACT may provide each layer of the deep neural network with nonlinearity. For example, the activation function ACT may include any of a Rectified Linear Unit (ReLU) function, a Sigmoid function, a Hyperbolic tangent function, and so forth. In order to improve a processing speed of the deep neural network, the activation function ACT may be processed through the use of a lookup table (hereinafter, referred to as a "LUT") that includes function values of the activation function ACT.

For example, a Long Short-Term Memory (LSTM) algorithm may be executed using the Sigmoid function and the Hyperbolic tangent function based on the following equations E1 to E6. In Equations E1 to E6, "σ" represents the Sigmoid function, "tanh" represents the Hyperbolic tangent function, "W" and "U" are weighted matrixes, "x" represents a data value, and "b" represents a bias vector.

$$f_t = \sigma(W_f x_t + U_f h_{t-1} + b_f) \quad \text{[Equation E1]}$$

$$i_t = \sigma(W_i x_t + U_i h_{t-1} + b_i) \quad \text{[Equation E2]}$$

$$a_t = \tanh(W_g x_t + U_g h_{t-1} + b_g) \quad \text{[Equation E3]}$$

$$o_t = \sigma(W_o x_t + U_o h_{t-1} + b_o) \quad \text{[Equation E4]}$$

$$c_t = f_t * c_{t-1} + i_t * a_t \quad \text{[Equation E5]}$$

$$h_t = o_t * \tanh(c_t) \quad \text{[Equation E6]}$$

As can be seen from the above equations E1 to E6, the LSTM algorithm utilizes the Sigmoid function in equations E1, E2, and E4 and the Hyperbolic tangent function in equations E3 and E6. That is, the LSTM algorithm uses both of the Sigmoid function and the Hyperbolic tangent function. The processing speed of the deep neural network may be improved when processing the Sigmoid function and the Hyperbolic tangent function by referring to LUTs.

Figure 2:
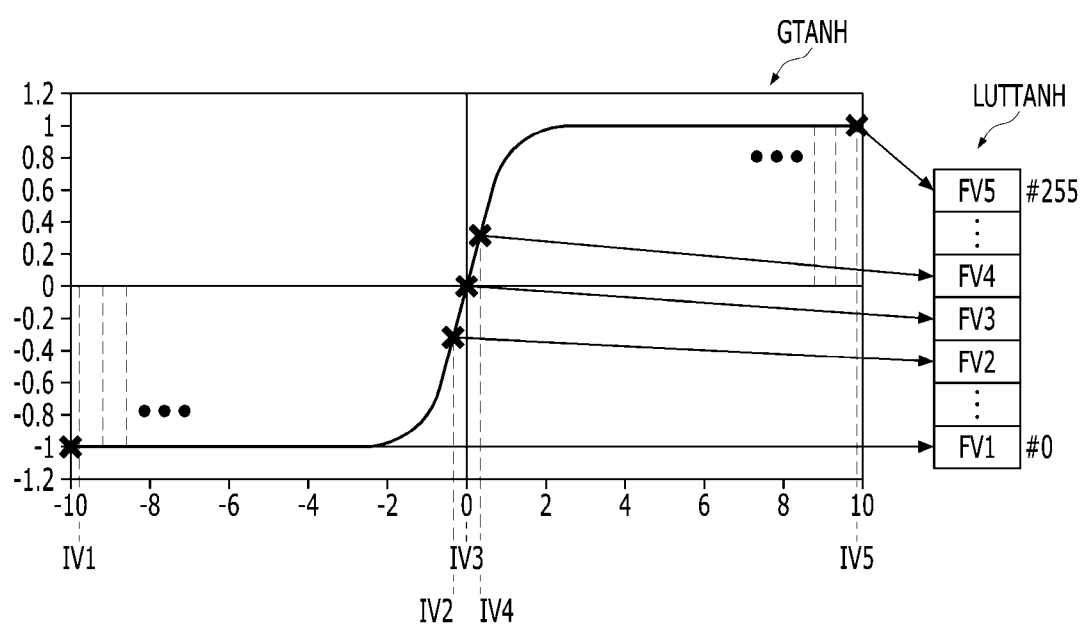
FIG. 2 illustrates a method of determining a function value of a Hyperbolic tangent function by referring to a LUT.

FIG. 2 illustrates a method of determining a function value of the Hyperbolic tangent function by referring to a LUT.

Referring to FIG. 2, a graph GTANH may represent the Hyperbolic tangent function. An x-axis may represent an input value of the Hyperbolic tangent function and a y-axis may represent a function value of the Hyperbolic tangent function, the function value corresponding to the input value.

A lookup table LUTTANH may include a plurality of function values selected from a y-range of the Hyperbolic tangent function. For example, when a depth of the lookup table LUTTANH is 256, the lookup table LUTTANH may include 256 entries respectively corresponding to addresses from '0' to '255.' The 256 entries may include 256 function values, respectively, selected from the y-range of the Hyperbolic tangent.

In this case, a particular input value may be converted into one of the addresses indicating the entries of the lookup table LUTTANH according to a predetermined address conversion rule. A function value of the Hyperbolic tangent function corresponding to the particular input value may be determined to be a function value that is included in an entry indicated by the converted address within the lookup table LUTTANH.

For example, referring to FIG. 2, an input value IV5 may be converted into the address '255' within the lookup table LUTTANH and a function value FV5 corresponding to the address '255' within the lookup table LUTTANH may be determined to be a function value of the Hyperbolic tangent function corresponding to the input value IV5. According to such a scheme, function values FV1 to FV4 within the lookup table LUTTANH may be determined to be function values of the Hyperbolic tangent function respectively corresponding to input values IV1 to IV4.

That is, a function value of the Hyperbolic tangent function corresponding to an input value may be determined using the lookup table LUTTANH, in which a predetermined function value corresponding to the input value is stored, instead of performing a complicated operation to calculate a real function value for the input value. The address conversion rule may be determined to convert each of input values into a corresponding one of the addresses of the lookup table LUTTANH.

By a similar way to the above method for the Hyperbolic tangent function described with reference to FIG. 2, a function value of the Sigmoid function for an input value may be determined using a lookup table LUT dedicated to the Sigmoid function. The same address conversion rule may be applied for both of the Hyperbolic tangent function and the Sigmoid function or different address conversion rules may be applied respectively for the Hyperbolic tangent function and the Sigmoid function.

According to an embodiment, a plurality of LUTs may be utilized for each activation function in order to improve the performance. For example, 8 LUTs may be utilized for the Hyperbolic tangent function. In this case, the 8 LUTs may be simultaneously accessed and thus 8 function values of the Hyperbolic tangent function may be simultaneously output for 8 different input values. However, utilizing a plurality of LUTs for each activation function may increase memory costs.

Due to a similar reason, utilizing different LUTs for the Sigmoid function and the Hyperbolic tangent function may also increase the memory costs. In accordance with an embodiment to be described later, the same LUT may be shared by different activation functions and thus the memory costs may be effectively reduced.

Figure 3:
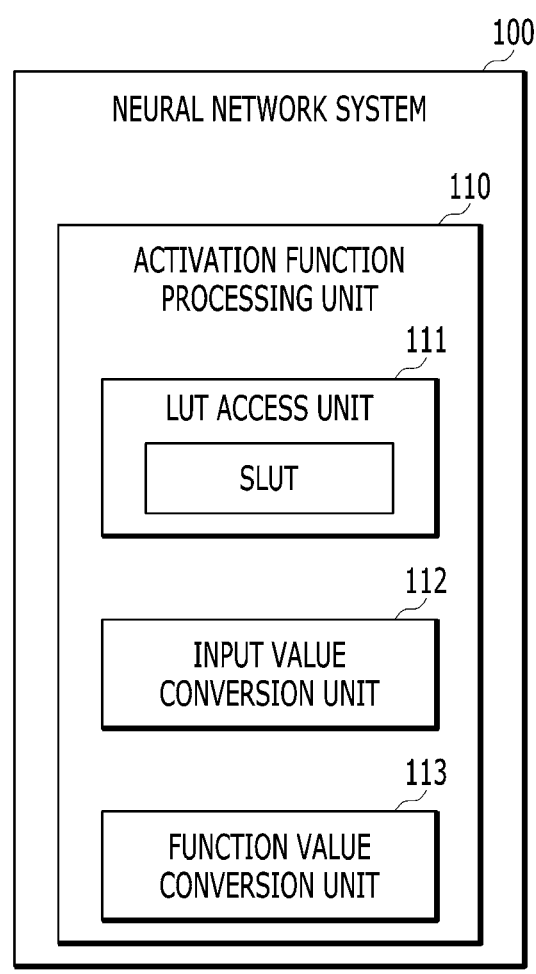
FIG. 3 illustrates a neural network system in accordance with an embodiment.

FIG. 3 illustrates a neural network system 100 in accordance with an embodiment.

Referring to FIG. 3, the neural network system 100 may process a learning operation of a deep neural network based on first and second activation functions. The neural network system 100 may include an activation function processing unit 110 configured to process the first and second activation functions.

The activation function processing unit 110 may process the first activation function in a first mode and the second activation function in a second mode. For example, when an input value corresponding to the first activation function is input, the activation function processing unit 110 may operate in the first mode and determine a function value of the first activation function corresponding to the input value. When an input value corresponding to the second activation function is input, the activation function processing unit 110 may operate in the second mode and determine a function value of the second activation function corresponding to the input value. The activation function processing unit 110 may utilize a shared lookup table SLUT to determine a function value corresponding to an input value for both of the first activation function and the second activation function.

The activation function processing unit 110 may include a LUT access unit 111, an input value conversion unit 112, and a function value conversion unit 113.

In an embodiment, the shared lookup table SLUT may be configured on the basis of the first activation function. An operation of processing the first activation function in the first mode and an operation of processing the second activation function in the second mode will be described using the shared lookup table SLUT configured based on the first activation function.

The operation of processing the first activation function in the first mode may include determining a function value and may be performed by the LUT access unit 111.

In the first mode, the LUT access unit 111 may convert an input value of the first activation function into a corresponding one of addresses of the shared lookup table SLUT according to a predetermined address conversion rule, and may output, as a function value of the first activation function corresponding to the input value, a function value corresponding to the converted address within the shared lookup table SLUT.

The shared lookup table SLUT may be configured on the basis of the first activation function. In other words, each of input values of the first activation function may be converted, according to the predetermined address conversion rule, into a corresponding one of addresses of the shared lookup table SLUT. The shared lookup table SLUT may include a plurality of function values selected from among all function values of the first activation function. A scheme of processing the first activation function by referring to the shared lookup table SLUT may be substantially the same as the scheme of processing the Hyperbolic tangent function by referring to the lookup table LUTTANH, which has been described with reference to FIG. 2. The shared lookup table SLUT may be stored in a memory (not illustrated) within the LUT access unit 111.

The operation of processing the second activation function in the second mode may include converting an input value of the second activation function, which is performed by the input value conversion unit 112, determining a function value, which may be performed by the LUT access unit 111, and converting the function value, which is performed by the function value conversion unit 113.

In the second mode, the input value conversion unit 112 may convert, based on an input value relation equation, the input value of the second activation function into an input value of the first activation function. The converted input value may be provided to the LUT access unit 111.

In the second mode, the LUT access unit 111 may operate in the same way as in the first mode. That is, in the second mode, the LUT access unit 111 may convert the converted input value, which is provided from the input value conversion unit 112, into a corresponding one of the addresses of the shared lookup table SLUT according to the predetermined address conversion rule, and may output, as a function value of the first activation function corresponding to the converted input value, a function value corresponding to the converted address within the shared lookup table SLUT. The function value, which is output from the LUT access unit 111 in the second mode, may be provided to the function value conversion unit 113.

The function value conversion unit 113 may receive the function value of the first activation function from the LUT access unit 111. The function value conversion unit 113 may convert, based on a function value relation equation, the function value of the first activation function into a function value of the second activation function.

That is, the shared lookup table SLUT may be utilized for processing the second activation function even though the shared lookup table SLUT is configured on the basis of the first activation function. The utilization of the shared lookup table SLUT for processing both the first activation function and the second activation function rather than utilization of different LUTs respectively for processing the first activation function and the second activation function may reduce memory costs.

In an embodiment, the activation function processing unit 110, which includes the LUT access unit 111, the input value conversion unit 112, and the function value conversion unit 113, may be implemented using one or more processors and a storage such as a memory.

According to an embodiment, the first activation function may be the Hyperbolic tangent function and the second activation function may be the Sigmoid function. In this embodiment, the shared lookup table SLUT may be configured on the basis of the Hyperbolic tangent function. This will be described with reference to FIGS. 4 and 5.

According to another embodiment, the first activation function may be the Sigmoid function and the second activation function may be the Hyperbolic tangent function. In this embodiment, the shared lookup table SLUT may be configured on the basis of the Sigmoid function. This will be described with reference to FIGS. 6 and 7.

Figure 4:
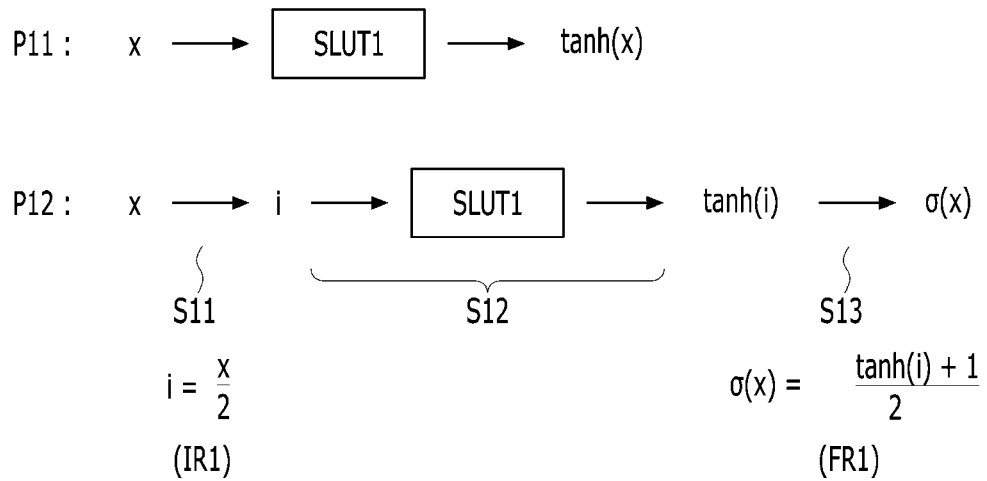
FIG. 4 illustrates a method of processing a Hyperbolic tangent function and a Sigmoid function by referring to a shared LUT in accordance with an embodiment.

FIG. 4 illustrates a method of processing the Hyperbolic tangent function and the Sigmoid function by referring to a shared lookup table in accordance with an embodiment. The method may be performed by the activation function processing unit 110 shown in FIG. 3.

Referring to FIG. 4, a shared lookup table SLUT1 may correspond to the shared lookup table SLUT described with reference to FIG. 3. That is, the shared lookup table SLUT1 may be configured on the basis of the Hyperbolic tangent function. Therefore, each of input values of the Hyperbolic tangent function may be converted, according to a predetermined address conversion rule, into a corresponding one of addresses of the shared lookup table SLUT1. The shared lookup table SLUT1 may include a plurality of function values selected from among all function values of the Hyperbolic tangent function, e.g., all function values shown in FIG. 2.

In FIG. 4, an operation P11 may be an operation of processing the Hyperbolic tangent function by utilizing the shared lookup table SLUT1. The operation P11 may be performed when the activation function processing unit 110 is in the first mode. In the operation P11, the LUT access unit 111 may convert an input value 'x' of the Hyperbolic tangent function into a corresponding one of the addresses of the shared lookup table SLUT1, and may determine, as a function value 'tanh(x),' a function value corresponding to the converted address within the shared lookup table SLUT1. A scheme of the operation P11 may be substantially the same as the scheme of processing the Hyperbolic tangent function described with reference to FIG. 2. An operation P12 may be an operation of processing the Sigmoid function by utilizing the shared lookup table SLUT1. The operation P12 may be performed when the activation function processing unit 110 is in the second mode.

A relation equation R1 representing a relationship between the Sigmoid function and the Hyperbolic tangent function is as follows.

[Relation Equation R1]
wherein σ represents the Sigmoid function, tanh represents the Hyperbolic tangent function, x is an input value of the Sigmoid function.

Based on the relation equation R1, an input value relation equation IR1 and a function value relation equation FR1 may be obtained as follows.

[Input Value Relation Equation IR1]
i=x/2, wherein i is an input value of the Hyperbolic tangent function.

[Function Value Relation Equation FR1]
σ(x)=(tanh(i)+1)/2, wherein tanh(i) is a function value of the Hyperbolic tangent function and σ(x) is a function value of the Sigmoid function.

Therefore, in the operation P12, the input value conversion is unit 112 may determine the input value 'i' by dividing the input value 'x' by 2 according to the input value relation equation IR1 in step S11. That is, in step S11, the input value 'x' of the Sigmoid function may be converted into the input value 'i' of the Hyperbolic tangent function.

In step S12, the LUT access unit 111 may convert the input value 'i' into a corresponding one of the addresses of the shared lookup table SLUT1, and may determine a function value corresponding to the converted address within the shared lookup table SLUT1 as the function value 'tanh(i).'

In step S13, the function value conversion unit 113 may determine the function value 'σ(x)' by adding 1 to the function value 'tanh(i)' and then dividing the addition result by 2 according to the function value relation equation FR1. That is, in step S13, the function value 'tanh(i)' of the Hyperbolic tangent function may be converted into the function value 'σ(x)' of the Sigmoid function.

Figure 5:
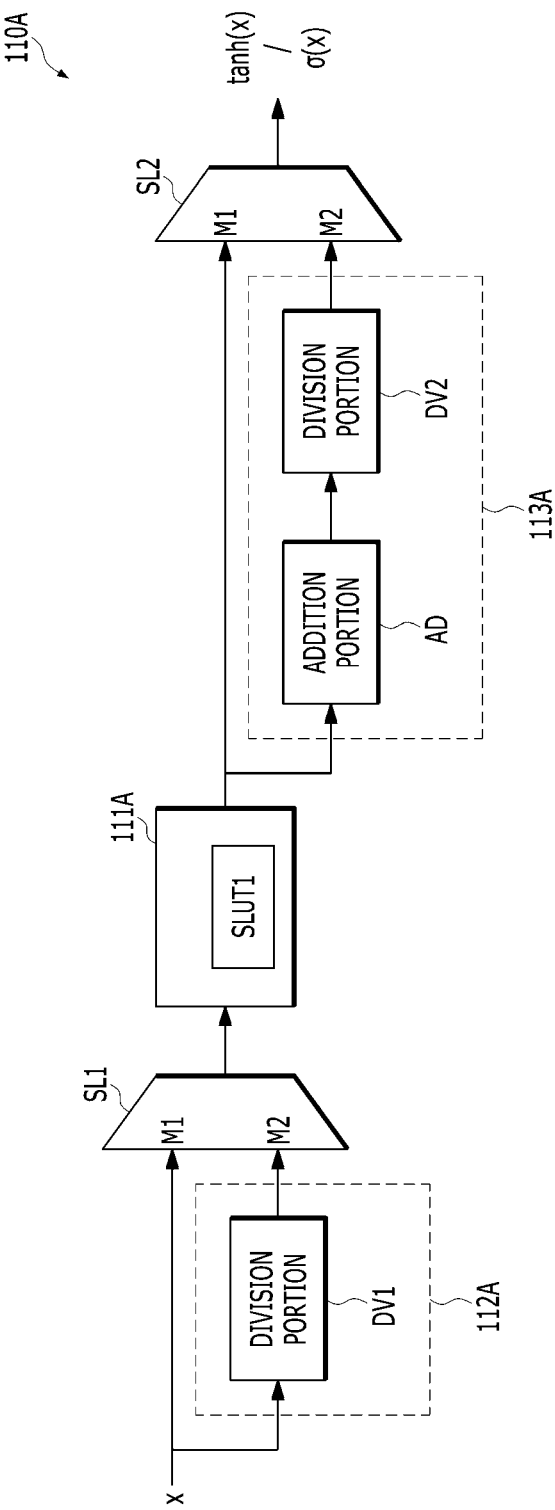
FIG. 5 illustrates an activation function processing unit in accordance with an embodiment.

FIG. 5 illustrates an activation function processing unit 110A in accordance with an embodiment. The activation function processing unit 110A is configured to selectively process the Hyperbolic tangent function and the Sigmoid function. The activation function processing unit 110A may correspond to the activation function processing unit 110 described with reference to FIG. 3. The activation function processing unit 110A may perform the operation P11 and the operation P12 described with reference to FIG. 4 in the first mode and the second mode, respectively.

Referring to FIG. 5, the activation function processing unit is 110A may determine the function value 'tanh(x)' for the input value 'x' in the first mode M1, and may determine the function value 'σ(x)' for the input value 'x' in the second mode M2, by referring to the shared lookup table SLUT1. The shared lookup table SLUT1 may be configured on the basis of the Hyperbolic tangent function.

The activation function processing unit 110A may include a LUT access unit 111A, an input value conversion unit 112A, a function value conversion unit 113A, and selection units SL1 and SL2.

The input value conversion unit 112A may convert the input value 'x' into an input value of the Hyperbolic tangent function based on the input value relation equation IR1. The input value conversion unit 112A may include a division portion DV1. The division portion DV1 may perform an operation of dividing the input value 'x' by 2. For example, the division portion DV1 may select bits other than the least significant bit within the input value 'x' and may pad '0' as the most significant bit to the selected bits. In an embodiment, the division portion DV1 may be implemented with a divider circuit.

The selection unit SL1 may receive the input value 'x' and an output of the division portion DV1 and may output one of the input value 'x' and the output of the division portion DV1 that is selected according to an activated mode. In particular, when the input value 'x' is an input value of the Hyperbolic tangent function and thus the first mode M1 is activated, the selection unit SL1 may select and output the input value 'x' to the LUT access unit 111A When the input value 'x' is an input value of the Sigmoid function and thus the second mode M2 is activated, the selection unit SL1 may select and output the output of the division portion DV1 to the LUT access unit 111A. In an embodiment, the selection unit SL1 may be implemented with a multiplexer or the like.

The LUT access unit 111A may convert the output of the selection unit SL1 into a corresponding one of the addresses of the shared lookup table SLUT1 and may output a function value corresponding to the converted address within the shared lookup table SLUT1.

The function value conversion unit 113A may convert the function value of the Hyperbolic tangent function output from the LUT access unit 111A into a function value of the Sigmoid function based on the function value relation equation FR1. The function value conversion unit 113A may include an addition portion AD and a division portion DV2.

The addition portion AD may perform an operation of adding 1 to the output of the LUT access unit 111A. In an embodiment, the addition portion AD may be implemented with an adder circuit.

The division portion DV2 may perform an operation of dividing an output of the addition portion AD by 2. For example, the division portion DV2 may select bits other than the least significant bit within the output of the addition portion AD and may pad '0' as the most significant bit to the selected bits. In an embodiment, the division portion DV2 may be implemented with a divider circuit.

The selection unit SL2 may receive the output of the LUT access unit 111A and an output of the division portion DV2 and may output one of the output of the LUT access unit 111A and the output of the division portion DV2 that is selected according to the activated mode. The selection unit SL2 may select the output of the LUT access unit 111A in the first mode M1 and may select the output of the division portion DV2 in the second mode M2. In an embodiment, the selection unit SL2 may be implemented with a multiplexer or the like.

Consequently, in the first mode M1, the activation function processing unit 110A may perform the operation P11 of FIG. 4 and the selection unit SL2 may output the function value 'tanh(x)' of the Hyperbolic tangent function corresponding to the input value 'x.' On the other hand, in the second mode M2, the activation function processing unit 110A may perform the operation P12 of FIG. 4 and the selection unit SL2 may output the function value 'σ(x)' of the Sigmoid function corresponding to the input value 'x.'

When utilizing the shared lookup table SLUT1, a range of the input value 'x' of the Sigmoid function may be twice a range of the input value 'x' of the Hyperbolic tangent function. For example, the range of the input value 'x' of the Sigmoid function may be [−10, 10] when the range of the input value 'x' of the Hyperbolic tangent function is [−5, 5].

To sum up, the utilization of the shared lookup table SLUT1, which is configured on the basis of the Hyperbolic tangent function, for processing both the Hyperbolic tangent function and the Sigmoid function may drastically reduce the memory costs compared to the utilization of different LUTs respectively for processing the Hyperbolic tangent function and the Sigmoid function.

Figure 6:
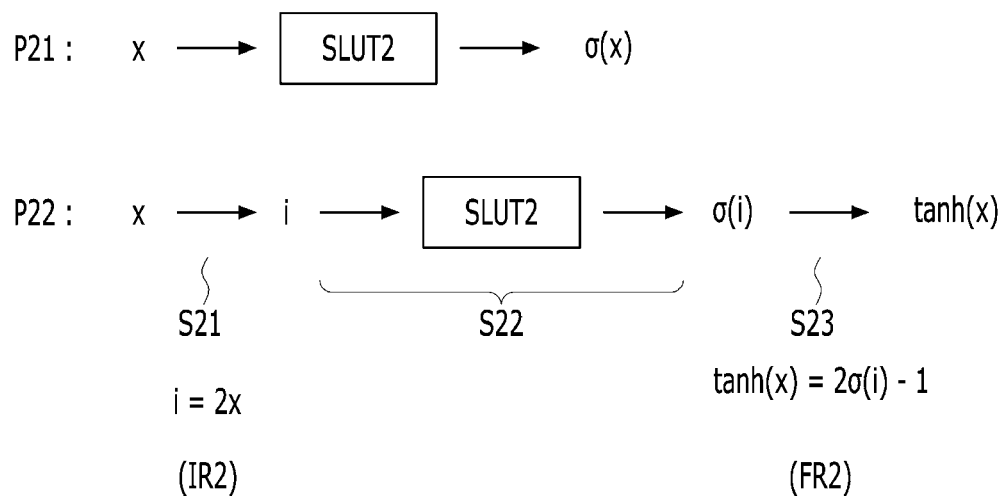
FIG. 6 illustrates a method of processing a Sigmoid function and a Hyperbolic tangent function by referring to a shared LUT in accordance with an embodiment.

FIG. 6 illustrates a method of processing the Sigmoid function and the Hyperbolic tangent function by referring to a shared lookup table in accordance with another embodiment. The method may be performed by the activation function processing unit 110 of FIG. 3.

Referring to FIG. 6, a shared lookup table SLUT2 may correspond to the shared lookup table SLUT described with reference to FIG. 3. The shared lookup table SLUT2 may be configured on the basis of the Sigmoid function. That is, each of input values of the Sigmoid function may be converted, according to a predetermined address conversion rule, into a corresponding one of addresses of the shared lookup table SLUT2. The shared lookup table SLUT2 may include a plurality of function values selected from among all function values of the Sigmoid function.

In FIG. 6, an operation P21 may be an operation of processing the Sigmoid function by utilizing the shared lookup table SLUT2. The operation P21 may be performed when the activation function processing unit 110 is in the first mode. In the operation P21, the LUT access unit 111 may convert an input value 'x' into a corresponding one of the addresses of the shared lookup table SLUT2, and may determine, as a function value 'σ(x),' a function value corresponding to the converted address within the shared lookup table SLUT2.

An operation P22 may be an operation of processing the Hyperbolic tangent function by utilizing the shared lookup table SLUT2. The operation P22 may be performed when the activation function processing unit 110 is in the second mode.

A relation equation R2 representing a relationship between the Hyperbolic tangent function and the Sigmoid function is as follows.

[Relation Equation R2]
$tanh(x)=2\sigma(2x)-1$, wherein x is an input value of the Hyperbolic tangent function.

Based on the relation equation R2, an input value relation equation IR2 and a function value relation equation FR2 may be obtained as follows.

[Input Value Relation Equation IR2]
$i=2x$, wherein i is an input value of the Sigmoid function.

[Function Value Relation Equation FR2]
$tanh(x)=2\sigma(i)-1$, wherein $\sigma(i)$ is a function value of the Sigmoid function and $tanh(x)$ is a function value of the Hyperbolic tangent function.

Therefore, in the operation P22, the input value conversion unit 112 may determine the input value 'i' by multiplying the input value 'x' by 2 according to the input value relation equation IR2 in step S21. That is, in step S21, the input value 'x' of the Hyperbolic tangent function may be converted into the input value 'i' of the Sigmoid function.

In step S22, the LUT access unit 111 may convert the input value 'i' into a corresponding one of the addresses of the shared lookup table SLUT2, and may determine a function value corresponding to the is converted address within the shared lookup table SLUT2 as the function value 'σ(x).'

In step S23, the function value conversion unit 113 may determine the function value 'tanh(x)' by multiplying the function value 'σ(x)' by 2 and then subtracting 1 from the multiplication result according to the function value relation equation FR2. That is, in step S23, the function value 'σ(i)' of the Sigmoid function may be converted into the function value 'tanh(x)' of the Hyperbolic tangent function.

Figure 7:
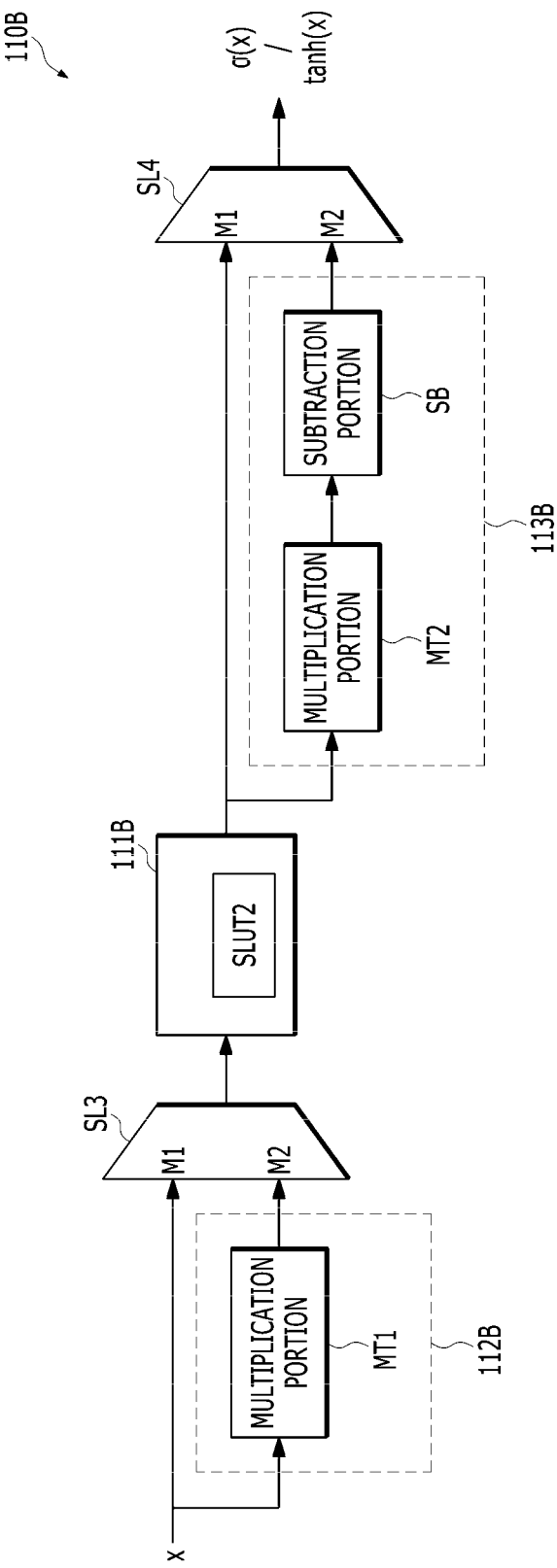
FIG. 7 illustrates an activation function processing unit in accordance with an embodiment.

FIG. 7 illustrates an activation function processing unit 1108 in accordance with an embodiment. The activation function processing unit 1108 is configured to selectively process the Sigmoid function and the Hyperbolic tangent function. The activation function processing unit 1106 may correspond to the activation function processing unit 110 described with reference to FIG. 3. The activation function processing unit 1106 may perform the operation P21 and the operation P22 described with reference to FIG. 6 in the first mode and the second mode, respectively.

Referring to FIG. 7, the activation function processing unit 1106 may determine the function value 'σ(x)' for the input value 'x' in the first mode M1, and may determine the function value 'tanh(x)' for the input value 'x' in the second mode M2, by referring to the shared lookup table SLUT2. The shared lookup table SLUT2 may be configured on the basis of the Sigmoid function.

The activation function processing unit 1106 may include a LUT access unit 111B, an input value conversion unit 112B, a function value conversion unit 113B, and selection units SL3 and SL4.

The input value conversion unit 112B may convert the input value 'x' into an input value of the Sigmoid function based on the input value relation equation IR2. The input value conversion unit 112B may include a multiplication portion MT1. The multiplication portion MT1 may perform an operation of multiplying the input value 'x' by 2. For example, the multiplication portion MT1 may pad '0' as the least significant bit to the input value 'x'. For example, the multiplication portion MT1 may select bits other than the most significant bit within the input value 'x' and may pad '0' as the least significant bit to the selected bits. In an embodiment, the multiplication portion MT1 may be implemented with a multiplier circuit.

The selection unit SL3 may receive the input value 'x' and an output of the multiplication portion MT1 and may output one of the input value 'x' and the output of the multiplication portion MT1 that is selected according to an activated mode. In particular, when the input value 'x' is an input value of the Sigmoid function and thus the first mode M1 is activated, the selection unit SL3 may select and output the input value 'x' to the LUT access unit 111B. and When the input value 'x' is an input value of the Hyperbolic tangent function and thus the second mode M2 is activated, the selection unit SL3 may select and output the output of the multiplication portion MT1 to the LUT access unit 111B. In an embodiment, the selection unit SL3 may be implemented with a multiplexer.

The LUT access unit 111B may convert the output of the selection unit SL3 into a corresponding one of the addresses of the shared lookup table SLUT2 and may output a function value corresponding to the converted address within the shared lookup table SLUT2.

The function value conversion unit 113B may convert the function value of the Sigmoid function output from the LUT access unit 111B into a function value of the Hyperbolic tangent function based on the function value relation equation FR2. The function value conversion unit 113B may include a multiplication portion MT2 and a subtraction portion SB.

The multiplication portion MT2 may perform an operation of multiplying an output of the LUT access unit 111B by 2. For example, the multiplication portion MT2 may pad '0' as the least significant bit to the output of the LUT access unit 111B. For example, the multiplication portion MT2 may select bits other than the most significant bit within the output of the LUT access unit 111B and may pad '0' as the least significant bit to the selected bits. In an embodiment, the multiplication portion MT2 may be implemented with a multiplier circuit.

The subtraction portion SB may perform an operation of subtracting 1 from an output of the multiplication portion MT2. In an embodiment, the subtraction portion SB may be implemented with a subtractor circuit.

The selection unit SL4 may receive the output of the LUT access unit 111B and an output of the subtraction portion SB and may output one of the output of the LUT access unit 111B and the output of the subtraction portion SB that is selected according to the activated mode. The selection unit SL4 may select the output of the LUT access unit 111B in the first mode M1 and may select the output of the subtraction portion SB in the second mode M2. In an embodiment, the selection unit SL4 may be implemented with a multiplexer.

Consequently, in the first mode M1, the activation function processing unit 110B may perform the operation P21 of FIG. 6 and the selection unit SL4 may output the function value 'σ(x)' of the Sigmoid function corresponding to the input value 'x.' On the other hand, in the second mode M2, the activation function processing unit 110B may perform the operation P22 of FIG. 6 and the selection unit SL4 may output the function value 'tanh(x)' of the Hyperbolic tangent function corresponding to the input value 'x.'

To sum up, the utilization of the shared lookup table SLUT2, which is configured on the basis of the Sigmoid function, for processing both the Sigmoid function and the Hyperbolic tangent function may drastically reduce the memory costs compared to the utilization of different LUTs respectively for processing the Sigmoid function and the Hyperbolic tangent function.

Figure 8A:
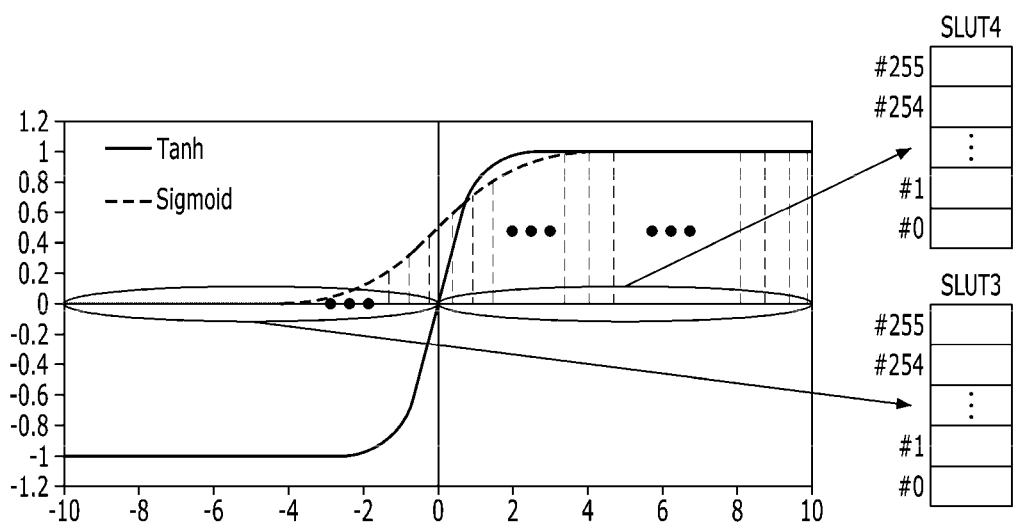
FIGS. 8A and 8B describe effects that resolution is improved through shared LUTs in accordance with an embodiment.
Figure 8B:
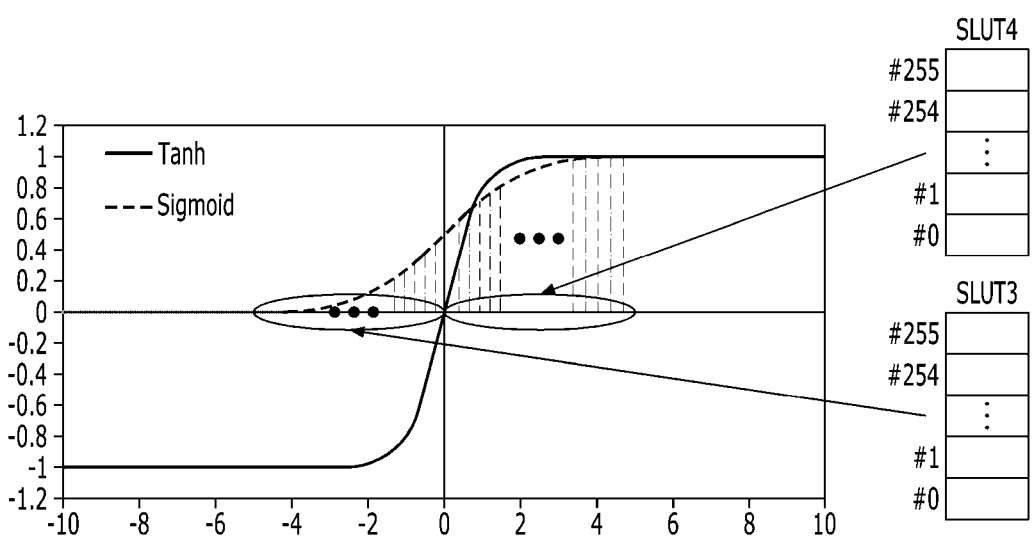

FIGS. 8A and 8B describe effects that resolution is improved through shared lookup tables SLUT3 and SLUT4 in accordance with an embodiment.

Referring to FIG. 8A, the shared lookup tables SLUT3 and SLUT4 each having a depth of '256' may be utilized in order to process the Hyperbolic tangent function and the Sigmoid function. For example, when the shared lookup tables SLUT3 and SLUT4 are configured on the basis of the Sigmoid function, the shared lookup table SLUT3 may be for an input value of the Sigmoid function that is in a range of [−10, 0], and the shared lookup table SLUT4 may be for an input value of the Sigmoid function that is in a range of (0, 10].

In this case, referring to FIG. 8B, the shared lookup table SLUT3 may be for an input value of the Hyperbolic tangent function that is in a range of [−5, 0], and the shared lookup table SLUT4 may be for an input value of the Hyperbolic tangent function that is in a range of (0, 5], according to the relation equation R2.

As such, when compared with a case of utilizing a LUT having a depth of '256' for the Hyperbolic tangent function and utilizing another LUT having a depth of '256' for the Sigmoid function, the utilization of the shared lookup tables SLUT3 and SLUT4 both configured based on one of the Hyperbolic tangent function and the Sigmoid function may double the resolution of a LUT for both of the Hyperbolic tangent function and the Sigmoid function while using the same memory capacity. That is, in accordance with an embodiment, the utilization of the shared lookup tables SLUT3 and SLUT4 both configured based on one of the Hyperbolic tangent function and the Sigmoid function may improve the LUT resolution without increase of the memory capacity.

In accordance with an embodiment, activation functions that are to be processed through the use of a shared lookup table are not be limited to the Sigmoid function and the Hyperbolic tangent function but may include different activation functions having a predetermined relationship therebetween.

Figure 9:
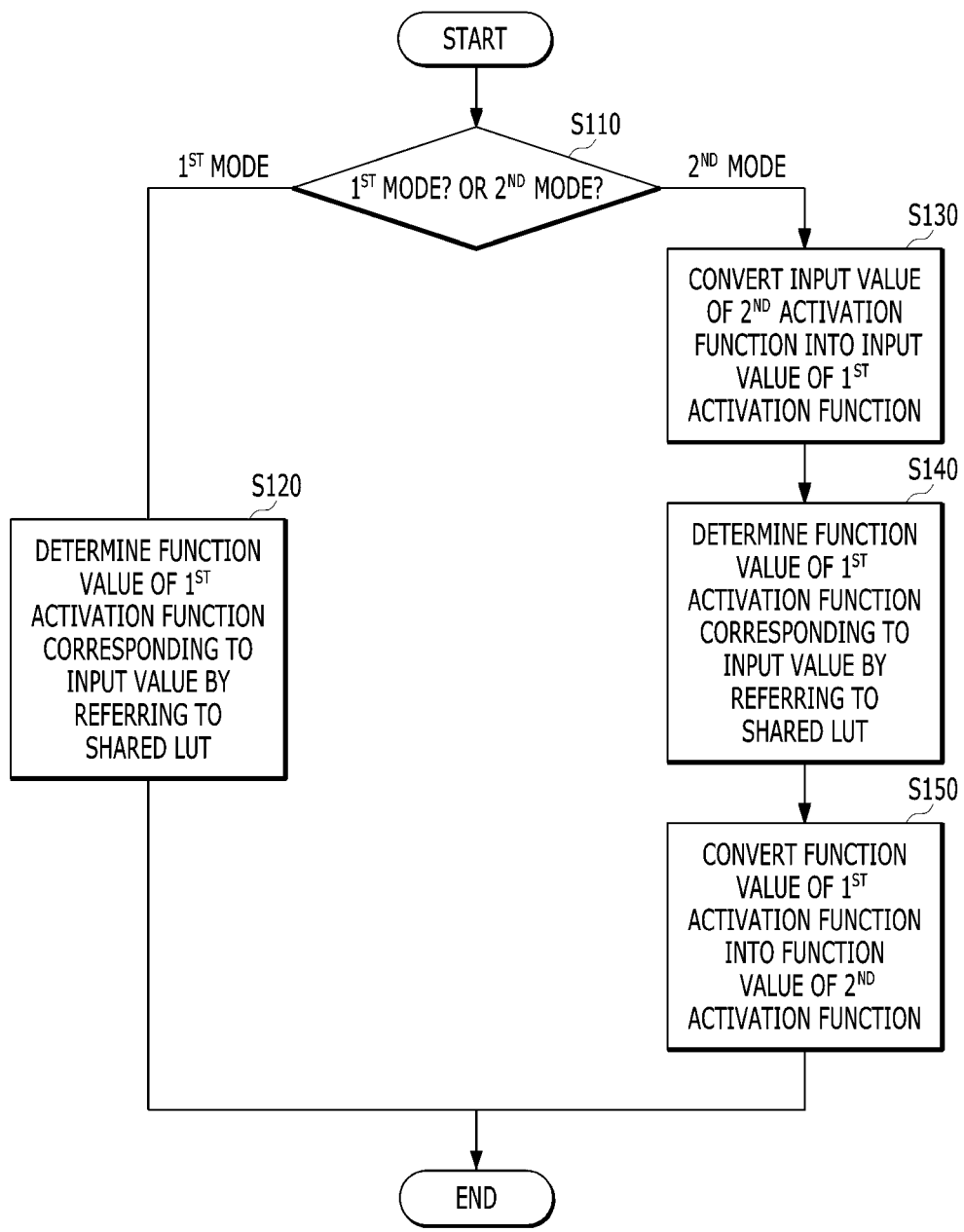
FIG. 9 is a flowchart illustrating an operating method of an activation function processing unit in accordance with an embodiment.

FIG. 9 is a flowchart illustrating an operating method of the activation function processing unit 110 of FIG. 3 in accordance with an embodiment.

Referring to FIG. 9, in step S110, the activation function processing unit 110 may determine an activated mode between the first mode and the second mode. The activation function processing unit 110 may determine the activated mode by determining one of first and second activation functions that is to be processed. When the activated mode is the first mode, the procedure may go to step S120. When the activated mode is the second mode, the procedure may go to step S130.

When the activated mode is the first mode, in step S120, the LUT access unit 111 may determine a function value corresponding to an input value of the first activation function by directly referring to the shared lookup table SLUT that is configured based on the first activation function.

On the other hand, when the activated mode is the second mode, in step S130, the input value conversion unit 112 may convert an input value of the second activation function into an input value of the first activation function based on the input value relation equation, e.g., IR1 or IR2.

In step S140, the LUT access unit 111 may determine a function value corresponding to the converted input value of the first activation function by referring to the shared lookup table SLUT.

In step S150, the function value conversion unit 113 may convert the function value of the first activation function into a function value of the second activation function based on the function value relation equation, e.g., FR1 or FR2. As a result, the activation function processing unit 110 can output the function value of the second activation function that corresponds to the input value of the second activation function even though the shared lookup table SLUT is configured based on the first activation function.

Figure 10:
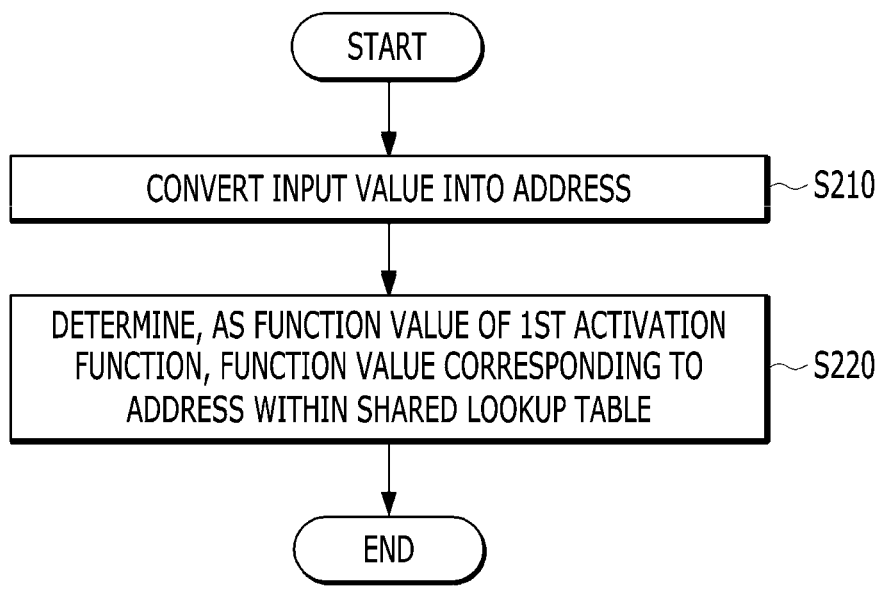
FIG. 10 is a flowchart illustrating an operating method of a LUT access unit in accordance with an embodiment.

FIG. 10 is a flowchart illustrating an operating method of the LUT access unit 111 of FIG. 3 in accordance with an embodiment. The method illustrated in FIG. 10 may be an embodiment of steps S120 and S140 of FIG. 9.

Referring to FIG. 10, in step S210, the LUT access unit 111 may convert the input value of the first activation function into a corresponding one of addresses of the shared lookup table SLUT.

In step S220, the LUT access unit 111 may determine, as the function value of the first activation function, a function value corresponding to the converted address within the shared lookup table SLUT.

While certain embodiments have been described above, it will be understood to those skilled in the art that the embodiments described are by way of example only. Accordingly, the activation function processing method, the activation function processing circuit, and the neural network system including the same should not be limited to the described embodiments. Rather, the activation function processing method, the activation function processing circuit, and the neural network system including the same described herein should only be limited in light of the claims that follow when taken in conjunction with the above description and accompanying drawings.

What is claimed is:

1. A computer implemented method using one or more hardware processors and a memory for activation function processing, the method comprising:

processing a first activation function in a first mode by referring to a shared lookup table that includes a plurality of function values of the first activation function, wherein the shared lookup table includes at least a plurality of function values of a Sigmoid function or of a Hyperbolic tangent function; and processing a second activation function in a second mode based on the plurality of function values of the first activation function in the shared lookup table, the second activation function being a different function than the first activation function, wherein the processing of the first activation function and the second activation function is implemented using the one or more hardware processors and the memory.

2. The method of claim 1, wherein the processing of the second activation function in the second mode includes:

receiving an input value of the second activation function in the second mode;

converting the input value of the second activation function into an input value of the first activation function;

determining, by referring to the shared lookup table, a function value of the first activation function corresponding to the input value of the first activation function; and converting the function value of the first activation function into a function value of the second activation function.

3. The method of claim 1, wherein the processing of the first activation function in the first mode includes:

receiving an input value of the first activation function in the first mode; and determining, by referring to the shared lookup table, a function value of the first activation function corresponding to the input value of the first activation function.

4. The method of claim 3, wherein the determining of the function value of the first activation function includes:

converting, according to an address conversion rule, the input value of the first activation function into a corresponding one of a plurality of addresses respectively indicating a plurality of entries of the shared lookup table, the plurality of function values being respectively included in the plurality of entries; and determining, as the function value of the first activation function, a function value that is included in an entry indicated by the corresponding address within the shared lookup table, and wherein the address conversion rule is set for each of all input values of the first activation function to be converted into a corresponding one of the plurality of addresses of the shared lookup table.

5. The method of claim 1, wherein the first activation function is the Sigmoid function; and wherein the second activation function is the Hyperbolic tangent function.

6. The method of claim 1, wherein the first activation function is the Hyperbolic tangent function; and wherein the second activation function is the Sigmoid function.

7. A circuit, comprising:

a lookup table access unit configured to determine a function value of a first activation function corresponding to an input value of the first activation function by referring to a shared lookup table that includes a plurality of function values of the first activation function, wherein the shared lookup table includes at least a plurality of function values of a Sigmoid function or of a Hyperbolic tangent function;

an input value conversion unit configured to convert an input value of a second activation function into the input value of the first activation function in a predetermined mode based on the plurality of function values of the first activation function included in the shared lookup table, the second activation function being a different function than the first activation function; and a function value conversion unit configured to convert the function value of the first activation function into a function value of the second activation function in the predetermined mode, wherein the lookup table access unit, the input value conversion unit, and the function value conversion unit are implemented using one or more hardware processors and a memory.

8. The circuit of claim 7, wherein, in the predetermined mode, the lookup table access unit receives the input value of the first activation function from the input value conversion unit and provides the function value conversion unit with the function value of the first activation function.

9. The circuit of claim 7, wherein the lookup table access unit converts the input value of the first activation function into a corresponding one of a plurality of addresses respectively indicating a plurality of entries of the shared lookup table, the plurality of function values being respectively included in the plurality of entries, and determines, as the function value of the first activation function, a function value that is included in an entry indicated by the corresponding address within the shared lookup table.

10. The circuit of claim 9, wherein the lookup table access unit converts, according to an address conversion rule, the input value of the first activation function into the corresponding address, wherein the address conversion rule is set for each of all input values of the first activation function to be converted into a corresponding one of the plurality of addresses of the shared lookup table, and wherein the shared lookup table includes the plurality of function values selected from among all function values of the first activation function.

11. The circuit of claim 7, wherein the first activation function is the Sigmoid function; and wherein the second activation function is the Hyperbolic tangent function.

12. The circuit of claim 11, wherein the function value conversion unit converts a function value of the Sigmoid function into a function value of the Hyperbolic tangent function based on an equation:

$$\tanh(x)=2\sigma(2x)-1,$$

wherein $\sigma(2x)$ represents the function value of the Sigmoid function, $\tanh(x)$ represents the function value of the Hyperbolic tangent function, x is an input value of the Hyperbolic tangent function, and wherein the circuit outputs the function value of the Hyperbolic tangent function as an output value in the predetermined mode.

13. The circuit of claim 7, wherein the first activation function is the Hyperbolic tangent function; and wherein the second activation function is the Sigmoid function.

14. The circuit of claim 13, wherein the function value conversion unit converts a function value of the Hyperbolic tangent function into a function value of the Sigmoid function based on an equation:

$$\sigma(x)=(\tanh(x/2)+1)/2,$$

wherein σ(x) represents the function value of the Sigmoid function, tanh(x/2) represents the function value of the Hyperbolic tangent function, x is an input value of the Sigmoid function, and wherein the circuit outputs the function value of the Sigmoid function as an output value in the predetermined mode.

15. A neural network system, comprising:

an activation function processing unit implemented using one or more hardware processors and a memory configured to:

receive a first input value of a first activation function and determine a function value of the first activation function corresponding to the first input value based on a shared lookup table including a plurality of function values of the first activation function, wherein the shared lookup table includes at least a plurality of function values of a Sigmoid function or of a Hyperbolic tangent function; and receive a second input value of a second activation function and determine a function value of the second activation function corresponding to the second input value based on one of the plurality of function values of the first activation function in the shared lookup table, the first and second activation functions being different functions.

16. The neural network system of claim 15, wherein the activation function processing unit includes:

a lookup table access unit configured to convert the first input value of the first activation function into a corresponding one of a plurality of addresses respectively indicating a plurality of entries of the shared lookup table, the plurality of function values being respectively included in the plurality of entries, and determine, as the function value of the first activation function corresponding to the first input value, a function value that is included in an entry indicated by the corresponding address within the shared lookup table.

17. The neural network system of claim 16, wherein the activation function processing unit further includes an input value conversion unit configured to convert the second input value of the second activation function into an input value of the first activation function.

18. The neural network system of claim 17, wherein the lookup table access unit determines the one of the plurality of function values of the first activation function based on the input value of the first activation function, and wherein the activation function processing unit further includes a function value conversion unit configured to convert the one of the plurality of function values of the first activation function into the function value of the second activation function.

19. The neural network system of claim 15, wherein the first activation function is the Sigmoid function; and wherein the second activation function is the Hyperbolic tangent function.

20. The neural network system of claim 15, wherein the first activation function is the Hyperbolic tangent function; and wherein the second activation function is the Sigmoid function.

* * * * *